(12) United States Patent
Bojer et al.

(10) Patent No.: US 10,374,784 B2
(45) Date of Patent: Aug. 6, 2019

(54) ADAPTIVE MULTI-CARRIER FILTER RESPONSE SYSTEMS AND METHODS

(71) Applicant: wiSpry, Inc., Irvine, CA (US)

(72) Inventors: Jorgen Bojer, Vadum (DK); Arthur S. Morris, III, Raleigh, NC (US); Peter Dam Madsen, Aalborg (DK)

(73) Assignee: WISPRY, INC., Irvine, CA (US)

( * ) Notice: Subject to any disclaimer, the term of this patent is extended or adjusted under 35 U.S.C. 154(b) by 149 days.

(21) Appl. No.: 15/173,195

(22) Filed: Jun. 3, 2016

(65) Prior Publication Data

US 2016/0359607 A1    Dec. 8, 2016

Related U.S. Application Data

(60) Provisional application No. 62/171,881, filed on Jun. 5, 2015.

(51) Int. Cl.
*H03H 7/01* (2006.01)
*H03H 7/46* (2006.01)
(Continued)

(52) U.S. Cl.
CPC ......... *H04L 5/1461* (2013.01); *H03H 7/0115* (2013.01); *H03H 7/1758* (2013.01);
(Continued)

(58) Field of Classification Search
CPC ..... H04L 5/1461; H04L 5/001; H04L 5/0092; H04B 1/0057; H03H 7/1766; H03H 7/463;
(Continued)

(56) References Cited

U.S. PATENT DOCUMENTS 7,415,247 B1 * 8/2008 Vaisanen ............. H04B 1/0057
455/234.1
2004/0185795 A1   9/2004 Shamsaifar et al.
(Continued)

FOREIGN PATENT DOCUMENTS

EP           3304798 A      4/2018
WO    WO 2016/196981      12/2016

OTHER PUBLICATIONS

Written Opinion for Application No. PCT/US2016/035802 dated Sep. 7, 2016.
(Continued)

*Primary Examiner* — Walter J DiVito
(74) *Attorney, Agent, or Firm* — Jenkins, Wilson, Taylor & Hunt, P.A.

(57) ABSTRACT

The present subject matter relates to devices, systems, and methods that provide a programmable filter response in a wireless frequency division duplex system. In particular, in some embodiments, a tunable diplex filter for such a system includes a first tunable filter in communication between an input node and a first output node, the first tunable filter being tunable to define a first tunable pass band configured to have a minimum pass band insertion loss at frequencies that are higher than a first reject band, and a second tunable filter in communication between the input node and a second output node, the second tunable filter being tunable to define a second tunable pass band configured to have a minimum pass band insertion loss at frequencies that are lower than the first reject band.

14 Claims, 8 Drawing Sheets

(51) Int. Cl.
*H04B 1/00* (2006.01)
*H04L 5/00* (2006.01)
*H04L 5/14* (2006.01)

(52) U.S. Cl.
CPC .......... *H03H 7/1766* (2013.01); *H03H 7/463* (2013.01); *H04B 1/0057* (2013.01); *H04L 5/001* (2013.01); *H03H 2007/013* (2013.01); *H03H 2210/025* (2013.01); *H04L 5/0092* (2013.01)

(58) Field of Classification Search
CPC ............... H03H 7/0115; H03H 7/1758; H03H 2210/025; H03H 2007/013
See application file for complete search history.

(56) References Cited

U.S. PATENT DOCUMENTS

| | | | | |
|---|---|---|---|---|
| 2007/0109161 | A1* | 5/2007 | Shimizu | H04B 1/30 341/120 |
| 2007/0275684 | A1* | 11/2007 | Harada | H03D 7/14 455/185.1 |
| 2009/0285135 | A1* | 11/2009 | Rousu | H04B 1/0057 370/297 |
| 2009/0286569 | A1 | 11/2009 | Rousu et al. | |
| 2013/0028119 | A1* | 1/2013 | Ben-Eli | H04W 48/16 370/252 |
| 2013/0051284 | A1 | 2/2013 | Khlat | |
| 2013/0231064 | A1 | 9/2013 | Gudem et al. | |
| 2013/0250819 | A1 | 9/2013 | Khlat et al. | |
| 2013/0336181 | A1 | 12/2013 | Khlat et al. | |
| 2014/0055210 | A1 | 2/2014 | Black et al. | |
| 2014/0128091 | A1* | 5/2014 | Engstrom | H04W 48/18 455/454 |
| 2014/0334362 | A1* | 11/2014 | Granger-Jones | H04L 5/08 370/297 |
| 2015/0087246 | A1 | 3/2015 | Khlat | |
| 2015/0131492 | A1 | 5/2015 | Morris, III et al. | |
| 2016/0112072 | A1* | 4/2016 | Bauder | H04B 1/0057 370/297 |

OTHER PUBLICATIONS

International Search Report for Application No. PCT/US2016/035802 dated Sep. 7, 2016.
Notice of Publication for International Application No. PCT/US2016/035802 dated Dec. 8, 2016.
Notice of Publication for European Application No. 16804552.4 dated Mar. 14, 2018.
Extended European Search Report for Application No. 16804552.4 dated Dec. 19, 2018.

* cited by examiner

ADAPTIVE MULTI-CARRIER FILTER RESPONSE SYSTEMS AND METHODS

PRIORITY CLAIM

The present application claims the benefit of U.S. Provisional Patent Application Ser. No. 62/171,881, filed Jun. 5, 2015, the disclosure of which is incorporated herein by reference in its entirety.

TECHNICAL FIELD

The subject matter disclosed herein relates generally to areas involving tunable filters and antenna that may be tunable. More particularly, the subject matter disclosed herein relates to systems required to support multiple frequency bands. One such particular application would be within the field of cellular radio communication.

BACKGROUND

In modern handheld devices for cellular communication systems (e.g. 3GPP) there is a desire to support multiple frequency bands (e.g., 3GPP LTE bands 7, 1, 2, 3, 8, 5, and 13). Further in this regard, one particular area of interest has been for carrier aggregation (CA) radios, which provide the ability to support multiple receive carriers simultaneously. For example, such systems may be configured for transmitter and receiver frequency division duplexing (FDD), with transmitter and receiver(s) operating simultaneously at either one frequency separation or at varying frequency separation.

For small handheld devices, due to technology and size constraints, this kind of duplex operation has typically been achieved by switching between fixed frequency filters or duplex filters (e.g., dielectric coaxial resonator filters, SAW, BAW, FBAR) using semiconductor switches. In such a configuration, however, for each band of operation and for each combination of carrier aggregation pairs, a new set of hardware is needed (i.e., adding filters and switches when expanding band and carrier aggregation support).

In addition, for frequency division duplexing, an issue known as duplex self interference can arise from the high power of the transmitter challenging the linearity to which the receiver(s) can be set up with high gain to deal with low power reception levels. A spatial separation of receiver and transmitter antennas was the first way to deal with this issue.

Furthermore, for "over antenna duplex," where transmitter and receiver have separate antennas such that some duplex isolation is created between the antennas, a filter is commonly provided in the receive path and is configured to primarily reject the transmit frequency to avoid overdrive conditions and minimize intermodulation products in the receiver. Similarly, a filter is provided in the transmit branch and is configured to primarily reject the transmitter noise at receive frequency.

For carrier aggregation FDD application (e.g., LTE Advanced), a further issue arises with the simultaneous reception of multiple bands while filtering away the transmit carrier. With prior art fixed frequency filter technology, bandpass filters have been used in each receive path. Because these filters will reflect signals out of the pass band, however, precautions have to be made so that the reflection or impedance of one filter passing a first signal band will not disturb the in-band signal match of a 2nd (or Nth) filter branch passing a 2nd (or Nth) signal band (and similarly in the opposite direction). For closely spaced CA bands and with prior art fixed frequency filter (e.g., acoustic filters) solution, the OEM cellular terminal manufacturer will have to select specific carrier aggregation pairs of bands that should be simultaneously operable and then integrate one or more diplex filter banks into the terminal. Pairs of bands that have not been configured will not be CA compatible.

Accordingly, it would be desirable for these kinds of systems to be able to support multiple frequency bands while addressing the above constraints of multiple hardware sets, duplex self interference, and the interaction of multiple receive pass bands.

SUMMARY

In accordance with this disclosure, adaptive multi-carrier filter response systems and methods are provided. In one aspect, a tunable diplex filter for a wireless frequency division duplex system is provided. In some embodiments, such a filter includes a diplexer in communication between an input node and first and second output nodes, a first tunable filter in communication between the diplexer and the first output node, and a second tunable filter in communication between the diplexer and the second output node. The diplexer being can be configured to separate signals present at the input node into a first signal to the first output node and a second signal to the second output node. In addition, the first tunable filter can be selectively tunable to define a first reject band and a first tunable pass band configured to have a minimum pass band insertion loss at any of a range of frequencies that are higher than the first reject band, and the second tunable filter can be selectively tunable to define a second reject band and a second tunable pass band configured to have a minimum pass band insertion loss at any of a variety of frequencies that are lower than the first reject band.

In another aspect, the present subject matter provides wireless frequency division duplex system comprising a tunable diplex filter comprising an input node, a high-pass output node, and a low-pass output node. In particular, the tunable diplex filter can be configured to exhibit reject band characteristics and tunable pass band characteristics that are programmable such that signals passed to the high-pass output node have any of a range of frequencies that are above a desired transmit frequency and signals passed to the low-pass output node have any of a range of frequencies that are below the desired transmit frequency.

In another aspect, the present subject matter provides method for tuning a wireless frequency division duplex system, the method comprising identifying a first receive band, a second receive band, and a transmit band. Then, if one or both of the first receive band or the second receive band comprise frequencies that are greater than frequencies of the transmit band, the method can include tuning a first tunable filter to move a first tunable pass band towards the frequencies of the one or both of the first receive band or the second receive band, and tuning the first tunable filter to define a first reject band at the frequencies of the transmit band. Alternatively or in addition, if one or both of the first receive band or the second receive band comprise frequencies that are less than frequencies of the transmit band, the method can include tuning a second tunable filter to move a second tunable pass band towards the frequencies of the one or both of the first receive band or the second receive band, and tuning the second tunable filter to define a second reject band at the frequencies of the transmit band.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides reconfigurable filter response and receive devices, systems, and methods that can be capable of making a variable frequency response between input and output. (e.g., by tunable components and switchable receive circuits) In particular, the disclosed devices, systems, and methods can be adapted for use with different combinations of carrier aggregation bands and can solve the issue of removing unwanted interference (e.g., from a transmitter in the wireless communication terminal). In this way, the devices, systems, and methods disclosed herein can be used to reduce the number of inputs needed on a radio in order to support carrier aggregation (e.g., for processing up to three or more carrier aggregation channels) and/or to optimize the radio for carrier aggregation.

Figure 1A:
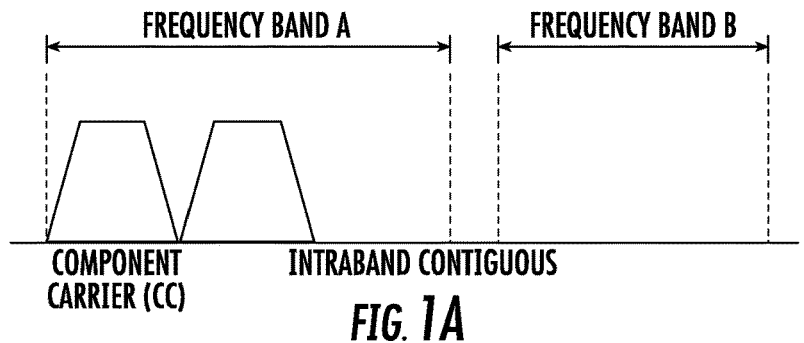
FIG. 1A is a schematic diagram of an intraband contiguous carrier aggregation combination.
Figure 1B:
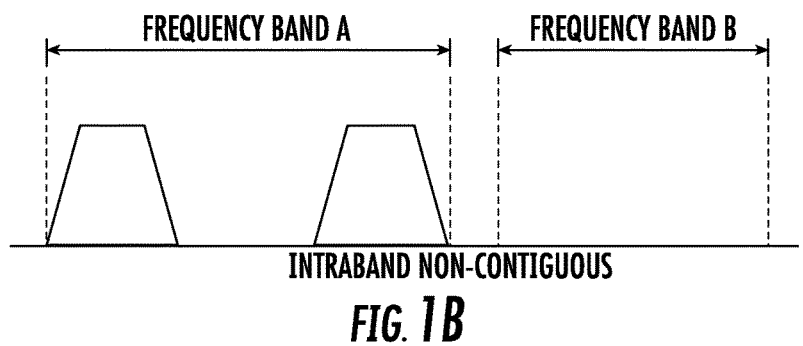
FIG. 1B is a schematic diagram of an intraband non-contiguous carrier aggregation combination.
Figure 1C:
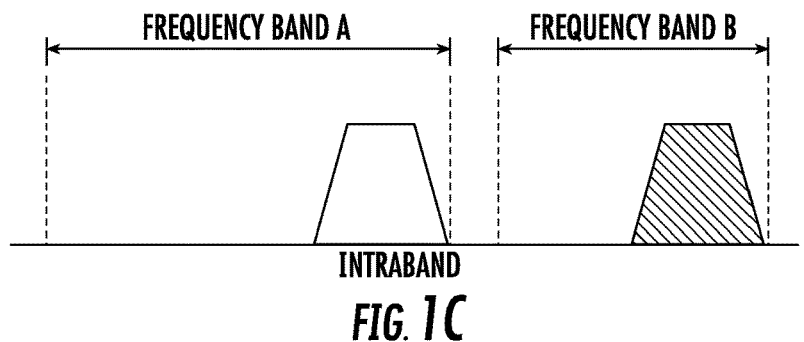
FIG. 1C is a schematic diagram of an interband carrier aggregation combination.

Specifically, for example, in one aspect, the present subject matter provides a solution to change the characteristics of a filter to accommodate multiple frequency bands and multiple combinations of bands for carrier aggregation. For instance, the characteristics of the filter can be changed to accommodate a variety of types of carrier aggregation, including intraband contiguous (See, e.g., FIG. 1A), intraband non-contiguous (See, e.g., FIG. 1B), and interband (See, e.g., FIG. 1C) carrier aggregation combinations. In some embodiments, such a solution features a programmable diplex filter that can adapt its filter characteristics to both positive and negative receive-to-transmit duplex spacings and carrier aggregation combinations of such nature. Furthermore, an implementation of such a programmable filter provides the capability of tuning the signal path frequency response among one or more input connection and one or more output connection. As used herein, the term "filter" should be understood widely as any hardware that generates a frequency-selective frequency response and can discriminate between receive and transmit frequency response (e.g., greater than about 8 dB).

Figure 2:
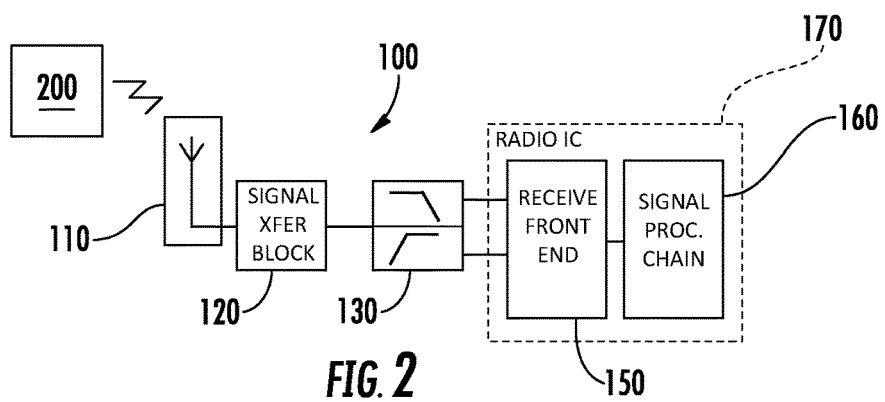
FIG. 2 is a schematic diagram of elements of a wireless frequency division duplex system according to an embodiment of the presently disclosed subject matter.

In this regard, as illustrated in FIG. 2, in some embodiments, the present subject matter provides a wireless frequency division duplex system, generally designated 100, that adapts filter responses to a given radio communication requirement. In particular, for example, duplex system 100 can be incorporated into a mobile terminal of a cellular communication system. In some embodiments, duplex system 100 comprises an antenna 110 in communication with a tunable diplex filter 130. Antenna 110 provides electromagnetic coupling of transmission or receive signals towards or from a remote wireless communication unit, generally designated 200, either through direct coupling (e.g., self-radiating antenna) or through coupling to another metallic surface (e.g., terminal ground chassis). In some embodiments, antenna 110 can contain one or more signal path input/output and can contain one or more connection points for load tuning. In addition, antenna 110 can contain a matching circuit that optionally can be tunable.

As should be understood herein, the signal normally consists of a modulated signal according to a wireless standard in accordance with a standardization body (e.g., 3GPP). In this regard, in some embodiments, remote wireless communication unit 200 is a transponding unit using a fixed-location antenna to serve one or more user or device within an area. This unit is commonly referred to in the cellular communication industry as a "basestation." For instance, examples of the various possible implementations for remote wireless communication unit 200 include 3GPP, BTS, NB, and eNB basestations. More specifically, BTS, NB, and eNB are all cellular basestations.

Furthermore, in some embodiments, duplex system comprises a signal transfer block 120 between antenna 110 and tunable diplex filter 130 to provide signal connections between antenna 110 and tunable diplex filter 130. For example, signal transfer block 120 can include one or more of a fixed frequency filter (e.g., a harmonic filter), an amplifier amplifying levels between input and outputs, an electromagnetic coupling path (inductive or capacitive), a circuit for maximizing signal bandwidth, a conductive connection between inputs and outputs (e.g., short or transmission line type), or combinations thereof.

Regardless of the particular configuration, antenna 110 and/or signal transfer block 120 provide an input to tunable diplex filter 130, which in turn provides a frequency-selective filtering response between its input and output terminals. In particular, in some embodiments, tunable diplex filter 130 has an input node, a first output node, and a second output node. With this arrangement, tunable diplex filter 130 can separate signals received from antenna 110 generally into a high band and a low band. As used herein, references to signals being "separated" should be understood by those having skill in the art to include both situations in which the high band and low band occupy separate and distinct signal bands and situations in which the signals output to the first and second output nodes do not necessarily occupy mutually exclusive frequency ranges.

In addition, tunable diplex filter 130 can further be controllable to define one or more tunable reject band characteristics and tunable pass band characteristics. In this way, a minimum pass band insertion loss can be programmed within one or both of a first reception filter diplex path to the first output node that passes a signal above a given reference frequency (e.g., the transmit frequency) and second reception filter diplex path to the second output node that passes a signal below the reference frequency.

In particular, for example, tunable diplex filter 130 may provide one or more of the following responses: a tunable high-pass band reject characteristic and programming mode allowing the primary reject band frequency(s) to be moved (e.g., a first notch that is movable with respect to the high-pass band for suppressing duplex self-interference); a tunable high-pass band pass characteristic and programming mode allowing the pass band frequency to be moved relative to the primary reject band frequency (i.e., duplex distance); a tunable low-pass band reject characteristic and programming mode allowing the primary reject frequency(s) to be moved (e.g., a second notch that is movable with respect to the low-pass band for suppressing duplex self-interference); and a tunable low-pass band pass characteristic and programming mode allowing the pass band frequency to be moved relative to the reject band frequency (i.e., duplex distance).

The signal response of tunable diplex filter 130 in a variety of exemplary operating modes is illustrated in FIGS. 3 through 6. In some situations where both (or all) of the carrier aggregation receive bands are on high side of the reference/transmit frequency (i.e., positive carrier aggregation duplex spacing), then all carrier aggregation receive bands can be processed through a high-pass signal path of tunable diplex filter 130 with a first possible transfer response shape 21 according to FIG. 3. Tunable reject band characteristics can be monitored as a change of notch frequency in the S21 transmission characteristics (e.g., illustrated in FIG. 3), where tunable pass band characteristics can be seen in the S21 transmission but is more significantly monitorable as a moving notch or reject band in the S11 reflection characteristics. These curves are provided in FIGS. 4A and 4B, which provide an example of tunable diplex receive high-pass filter response for positive carrier aggregation duplex spacing.

Figure 5:
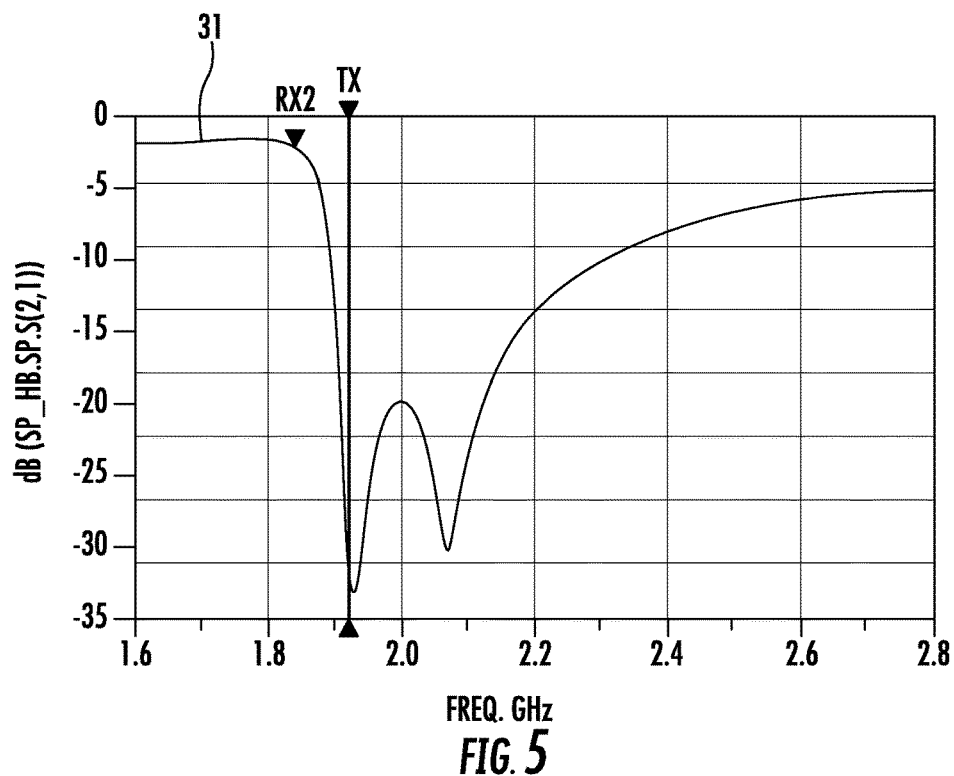
FIG. 5 is a graph illustrating a low-pass signal response of a tunable diplex filter according to an embodiment of the presently disclosed subject matter.
Figure 6:
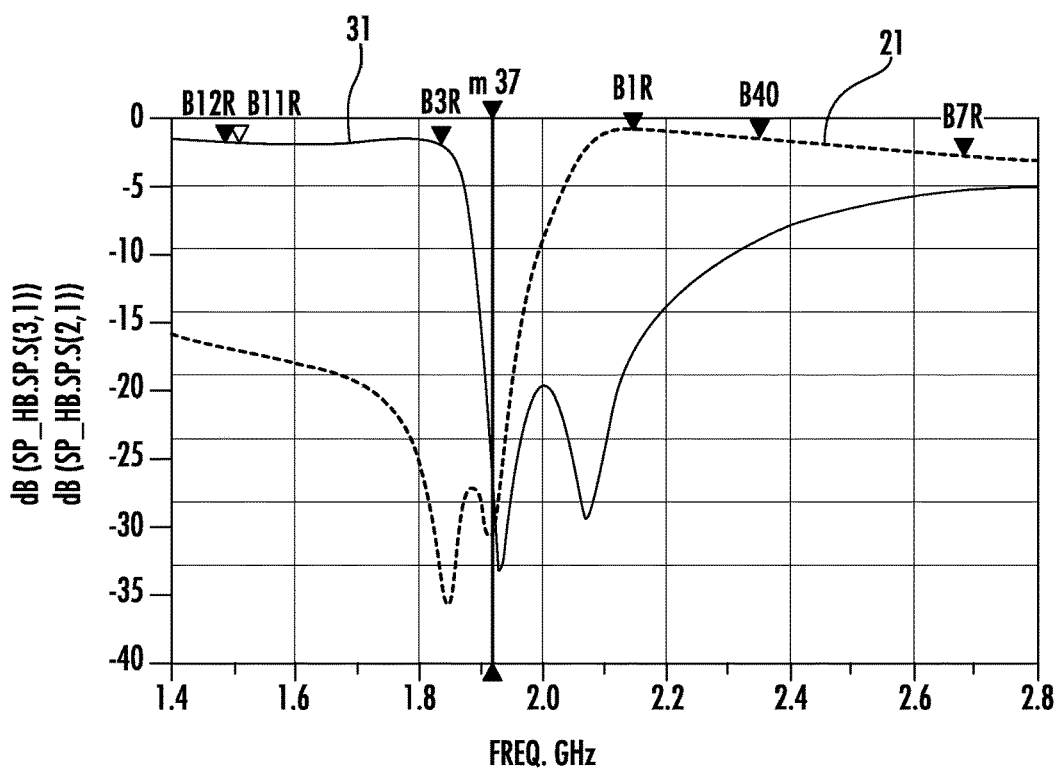
FIG. 6 is a graph illustrating the total signal response of a tunable diplex filter according to an embodiment of the presently disclosed subject matter.

Alternatively, if both (or all) of the carrier aggregation receive bands are on low side of the reference/transmit frequency (i.e., negative carrier aggregation duplex spacing), then all carrier aggregation receive bands can be processed through a low-pass signal path of tunable diplex filter 130 having a second possible transfer response shape 31 according to FIG. 5. In yet a further embodiment that is enabled by the design of tunable diplex filter 130, signals can be passed on both of the high-pass and the low-pass signal paths of tunable diplex filter 130 with respect to a common transmit signal therebetween. As illustrated in FIG. 6, for example, any of a variety of positive-duplex frequency bands are passed with first exemplary transfer response shape 21 on a high side of the transmit signal and any of a variety of negative-duplex frequency bands are passed with second exemplary transfer response shape 31 on a low side of the transmit signal. In this regard, any of a variety of combinations of carrier bands on either side of a given reference/transmit frequency can be aggregated while removing unwanted interference.

Figure 7:
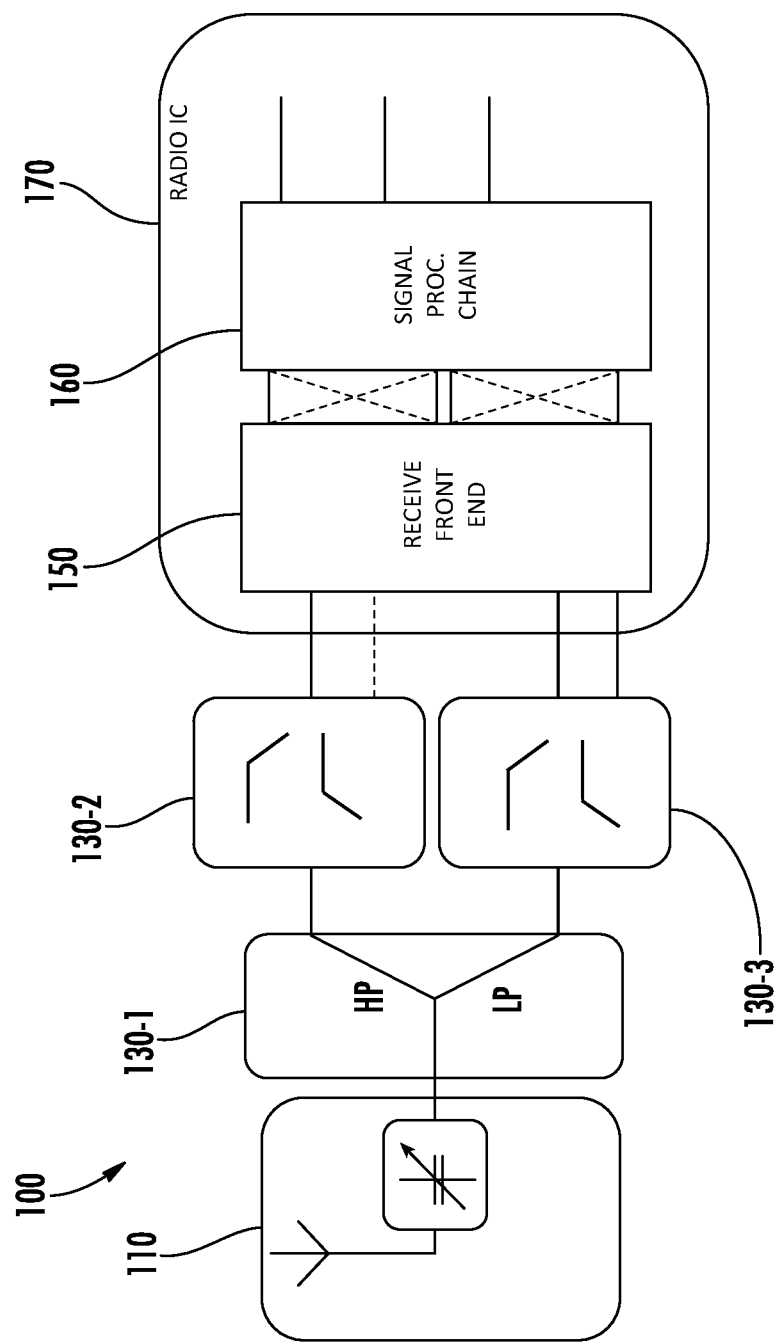
FIG. 7 is a schematic diagram of elements of a wireless frequency division duplex system according to another embodiment of the presently disclosed subject matter.

In an alternative configuration illustrated in FIG. 7, the function of tunable diplex filter 130 can be performed by multiple components to further improve the ability to support high bands separately from low bands. In this embodiment, rather than a single tunable diplex filter 130 being provided between antenna 110 and receive front end 150, a preselect diplexer 130-1 is positioned to receive a signal input from antenna 110 and/or signal transfer block 120 and provide a high-pass portion of the signal input to a tunable high-pass diplexer 130-2 and a low-pass portion of the signal input to tunable low-pass diplexer 130-3, which operate within the respective frequency regions to selectively pass the high-pass and low-pass outputs to receive front end 150. In this arrangement, the combination of these three components acts effectively as a quadplexer to provide fine control over the frequency bands that are passed to receive front end 150.

In particular, for example, preselect diplexer 130-1 can be configured to pass comparatively higher-frequency signals (e.g., signals in bands 1, 2, 3, 4, 7) to tunable high-pass diplexer 130-2 and to pass comparatively lower-frequency signals (e.g., signals in bands 5, 8, 12, 13, 14) to tunable low-pass diplexer 130-3. In some embodiments, the selection of which frequencies are passed to tunable high-pass diplexer 130-2 and tunable low-pass diplexer 130-3 by preselect diplexer 130-1 fixed. In other embodiments, preselect diplexer 130-1 is tunable to vary the frequency cutoffs at which the high-band and low-band are defined. In either configuration, tunable high-pass diplexer 130-2 and tunable low-pass diplexer 130-3 can be configured to further divide the received signals into multiple discrete bands. In this way, preselect diplexer 130-1 is operable to broadly separate incoming signals into either a high-band signal path or a low-band signal path, whereas tunable high-pass diplexer 130-2 and tunable low-pass diplexer 130-3 provide finer selection of the particular frequency bands into which the signal is further separated.

Figure 3:
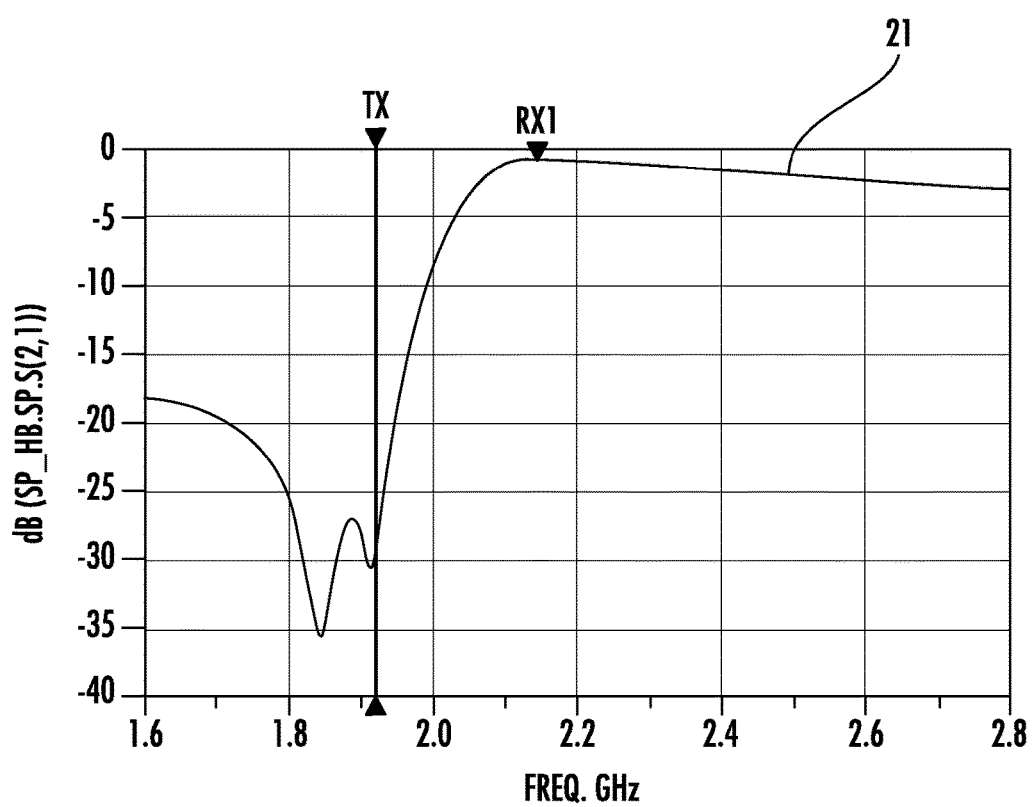
FIGS. 3, 4A, and 4B are graphs illustrating a high-pass signal response of a tunable diplex filter according to embodiments of the presently disclosed subject matter.
Figures 4A, 4B:
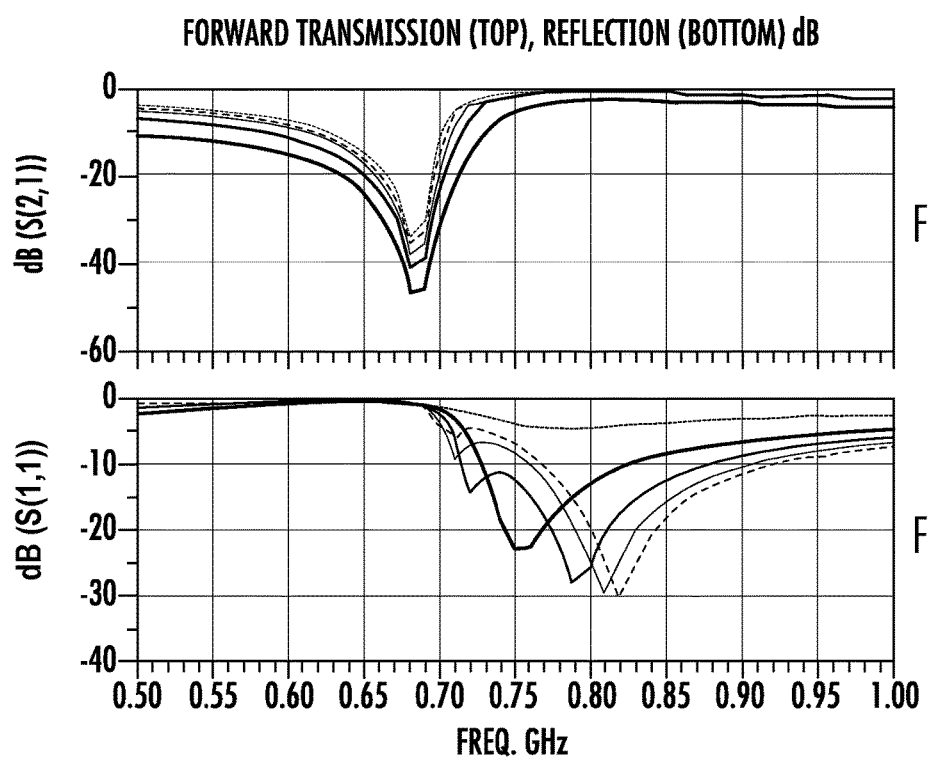
Figure 8:
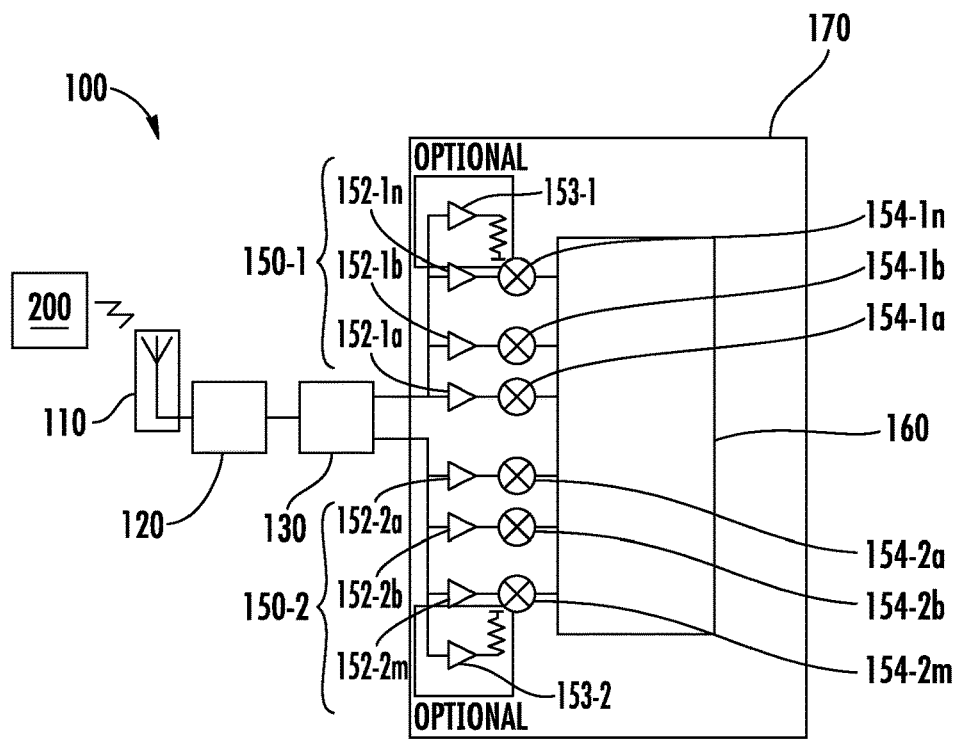
FIG. 8 is a schematic diagram of elements of a wireless frequency division duplex system according to an embodiment of the presently disclosed subject matter.

In any configuration, the outputs from tunable diplex filter 130 are then provided to a receive front end 150 and a signal processing chain 160. Receive front end 150 is the input to the signal path that further processes the receive signal, and signal processing chain 160 is the input(s) to the signal path to a unit that either further process the receive signal or the output from the signal path that process the transmission signal. As illustrated in FIGS. 2, 3, and 8, both of receive front end 150 and signal processing chain 160 can be implemented in a radio integrated circuit 170.

Regarding receive front end 150, in some embodiments, this element comprises one or more pairs of a low noise amplifier, generally designated 152, and a frequency-selection down-conversion mixer, generally designated 154. Furthermore, in some embodiments, receive front end 150 further comprise one or more of a variable-gain amplifier and/or additional systems for signal selection filtering. As discussed above, tunable diplex filter 130 can be configured to pass and split the receive signals into two parts while rejecting the transmit signal. In particular, in some embodiments, the two parts of the receive signal are the spectrums located below and above a given transmit signal. In this arrangement, these two signals are inputs of radio integrated circuit 170 to receive front end 150. In this way, as illustrated in FIG. 8, for example, receive front end 150 can be effectively divided into a high-pass subarray 150-1 and a low-pass subarray 150-2, with each of the two subarrays comprising one or more pairs of a low noise amplifier 152 and a down-conversion mixer 154.

Specifically, for example, in the embodiment illustrated in FIG. 8, high-pass subarray 150-1 comprises a first high-pass low-noise amplifier 152-1a and first high-pass mixer 154-1a, a second high-pass low-noise amplifier 152-1b and second high-pass mixer 154-1b, an nth high-pass low-noise amplifier 152-1n and nth high-pass mixer 154-1n, and so on. Similarly, low-pass subarray 150-2 comprises a first low-pass low-noise amplifier 152-2a and first low-pass mixer 154-2a, a second low-pass low-noise amplifier 152-2b and second low-pass mixer 154-2b, an mth low-pass low-noise amplifier 152-2m and mth low-pass mixer 154-2m, etc. In some embodiments, each of the low-noise amplifiers can be switched on and off independently. In addition, in some embodiments, one or more dummy low-noise amplifiers (e.g., a high-pass dummy low-noise amplifier 153-1 and a low-pass dummy low-noise amplifier 153-2) are connected to one or both subarrays to provide a constant impedance at the given input port. For instance, the dummy low-noise amplifiers can be switched on to compensate for a change of impedance when switching off another low-noise amplifier in the respective subarray.

Figure 9:
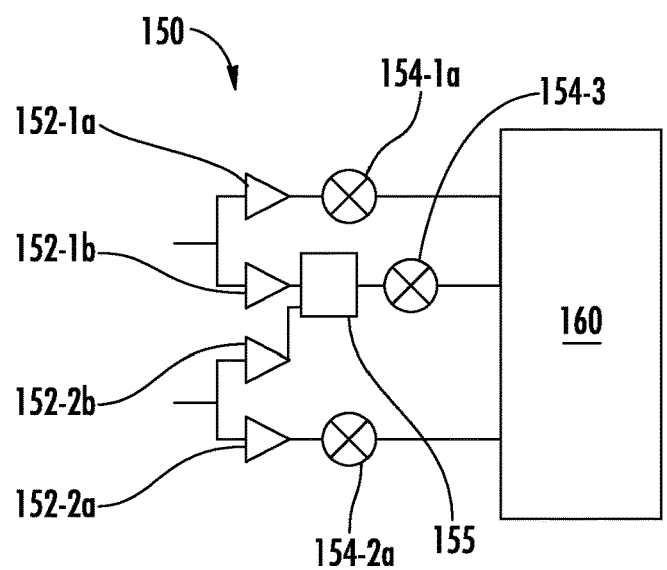
FIG. 9 is a schematic diagram of a receive front end of a wireless frequency division duplex system according to an embodiment of the presently disclosed subject matter.

Alternatively or in addition, in some embodiments, in order to reduce the total number of mixers, it is possible to reuse at least one of mixers 154 by switching the output of nth high-pass low-noise amplifier 152-1n and mth low-pass low-noise amplifier 152-2m to the same mixer. A compact implementation of this concept shown in FIG. 9, where a dedicated high-pass branch is provided by first high-pass low-noise amplifier 152-1a and first high-pass mixer 154-1a, and a dedicated low-pass branch is provided by first low-pass low-noise amplifier 152-2a and first low-pass mixer 154-2a, but second high-pass low-noise amplifier 152-1b and second low-pass low-noise amplifier 152-2b are both inputs to a switch or other connection 155, which is in communication with a shared down-conversion mixer 154-3.

In this arrangement, signals can be supplied to shared down-conversion mixer 154-3 by either selecting which of second high-pass low-noise amplifier 152-1b or second low-pass low-noise amplifier 152-2b passes signals at switch or connection 155. Alternatively, the signals that are supplied to shared down-conversion mixer 154-3 can be determined by which of second high-pass low-noise amplifier 152-1b or second low-pass low-noise amplifier 152-2b are activated (i.e., by switching off an unused/non-selected one of second high-pass low-noise amplifier 152-1b or second low-pass low-noise amplifier 152-2b). In any configuration, up to two carriers can be aggregated in any of a variety of combinations (e.g., intraband with both bands above the transmit frequency, intraband with both bands below the transmit frequency, or interband with one above and one below). In addition, some particular combinations containing three bands can further be accommodated by this arrangement (e.g., two bands above the transmit frequency and one band below or two bands below and one band above).

In any arrangement of receive front end 150, the one or more pairs of low-noise amplifier 152 and down-conversion mixer 154 can be selectively enabled based on the combination of bands desired for a given carrier aggregation solution of the wireless system. In general, each pair of a low-noise amplifier 152 and down-conversion mixer 154 is configured to be operable over as wide a band of frequencies as possible, although these components can be optimized for a set of bands appropriate for each of high-pass subarray 150-1 and low-pass subarray 150-2. In particular, for example, a low-noise amplifier 152 and down-conversion mixer 154 in high-pass subarray 150-1 can be optimized to process signals above a given threshold frequency (e.g., above about 1 GHz), whereas a low-noise amplifier 152 and down-conversion mixer 154 in low-pass subarray 150-2 can be optimized to process signals below such a threshold.

In a limiting case where carrier aggregation is not used, for example, only one pair of low-noise amplifier 152 and down-conversion mixer 154 is used. Alternatively, for a configuration where one carrier is aggregated in a spectrum above a given transmit signal, one LNA-mixer pair (e.g., first high-pass low-noise amplifier 152-1a) is enabled in the high-pass path, and one LNA-mixer pair (e.g., first low-pass low-noise amplifier 152-2a) is enabled in the appropriate path for a main band used. That is, in the context of a frequency-division duplexing system, the main band used is the receive band that is associated with the transmit band (e.g., carrier aggregation band 3-1 provides that transmission is on the transmit band of band 3 and the main receive band is accordingly the receive band of band 3, with the receive band of band 1 being used as an aggregated receive band). In a further alternative configuration, for the case where two carriers are both aggregated in the spectrum above the transmit signal, a total of three LNA-mixer pairs are used: two in the high-pass path for the aggregated carriers (e.g., first and second high-pass low-noise amplifiers 152-1a and 152-1b) and one LNA-mixer pair in the appropriate path for the main band used (e.g., first low-pass low-noise amplifier 152-2a). In yet a further alternative configuration, for a case where one carrier is aggregated in the spectrum below the transmit signal, a total of two LNA-mixer pairs will be used: one in the low-pass path (e.g., first low-pass low-noise amplifier 152-2a) and one in the in the appropriate path for the main band used. More generally, for any case with N−1 carriers that are aggregated, with n in the spectrum above the transmit frequency and m in the spectrum below the transmitter, receive front end 150 can comprise n high-pass LNA-mixer pairs and m low-pass LNA-mixer pairs. An additional path is used in the appropriate path for the main band used.

Figure 10:
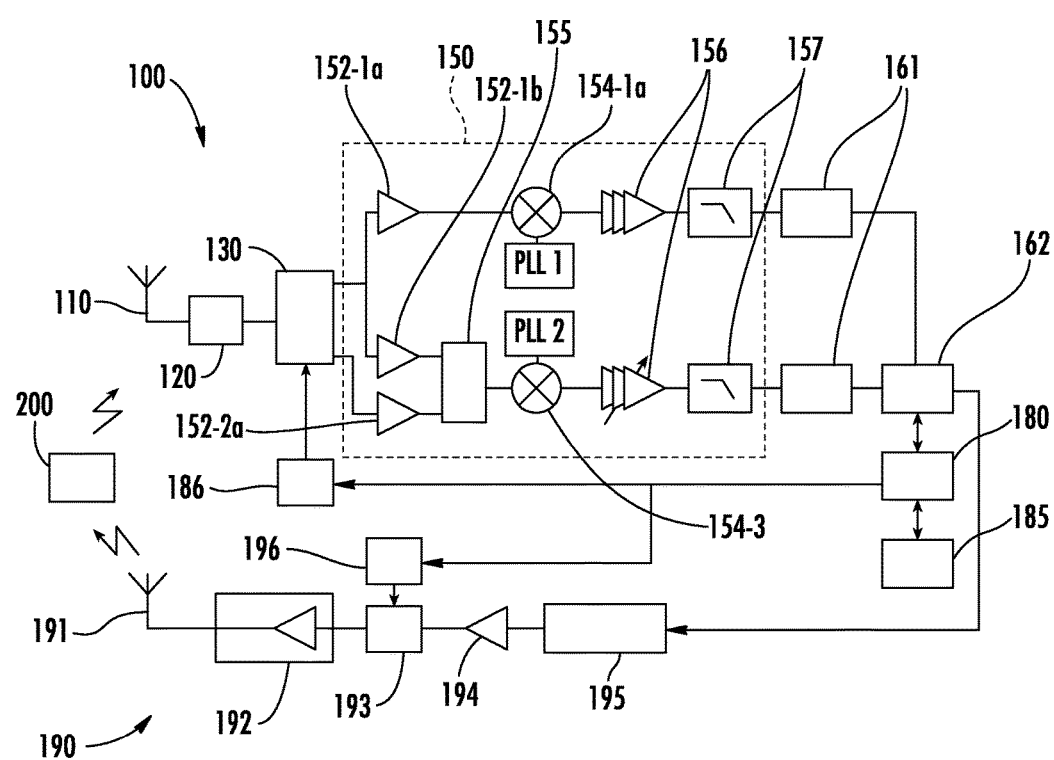
FIG. 10 is a schematic diagram of a wireless frequency division duplex system according to an embodiment of the presently disclosed subject matter.

Regardless of the particular configuration and/or carrier aggregation mode, the signals output by receive front end 150 can then be processed by signal processing chain 160. In particular, in some embodiments of a receive signal chain, signal processing chain 160 comprises one or more analog-to-digital converter and/or a digital signal processing system (e.g., DSP). Referring to one particular embodiment that is schematically illustrated in FIG. 10, wireless frequency division duplex system 100 comprises tunable diplex filter 130 in a receive signal chain and a tunable transmit filter 193 in a transmit chain 190 (e.g., which includes one or more of a separate transmit antenna 191, a transmit signal transfer block 192, tunable transmit filter 193, a power amplifier 194, a modulator 195, and a transmit filter controller 196). The receive signals can be processed by receive front end 150 and signal processing chain 160, wherein each carrier aggregation path comprises a low-noise amplifier 152, a frequency-selection down-conversion mixer 154, a variable gain amplifier 156, a signal-selection filtering system 157, an analog-to-digital convertor 161, and a digital signal processing system 162 (e.g. DSP).

In addition, in some embodiments, a master control unit 180 in communication with one or both of tunable diplex filter 130 (e.g., by way of a receive filter controller 186) and/or receive front end 150 is configured to control the communication protocols to and from remote wireless communication unit 200. Alternatively, in some embodiments, one or more elements of signal processing chain 160 is responsible for this control. In some particular implementations, for example, digital signal processing system 162 and master control unit 180 can have shared hardware and processor(s). In any configuration, one or both of receive filter controller 186 or transmit filter controller 196 can comprise a digital control interface (e.g., a SPI, I2C or an RFFE interface) with a latch register and decoding and connection circuit that is configured to read the latch register information and apply this information to adjust a tuning state of tunable diplex filter 130 and/or tunable transmit filter 193.

In addition, a multi media controller or applications processor 185 can further be provided to control the user operating system with graphical interface, user applications, etc.

Regardless of the particular configuration, as discussed above, tunable diplex filter 130 is configured to handle multiple receive signals concurrently on a single input. In particular, signals received through antenna 110 and signal transfer block 120 can be fed to both a first receive diplex path (e.g., tunable high-pass filter 131-1) and a second receive diplex path (e.g., tunable low-pass filter 131-2) in tunable diplex filter 130. Within this arrangement, the first receive diplex path can define a first tunable reject band and a first tunable pass band having frequencies that are higher relative to the first tunable reject band. Conversely, the second receive diplex path can define a second tunable reject band and a second tunable pass band having frequencies that are lower relative to the second tunable reject band.

To achieve this division of the receive signal, another aspect of the presently disclosed subject matter provides a tuning algorithm that controls tunable diplex filter 130 to define the first tunable reject band, the first tunable pass band, the second tunable reject band, and the second tunable pass band. In some embodiments, for example, such an algorithm is run in a processor (e.g., master control unit 180). In particular, such an algorithm can involve a process of establishing a scan of power over frequency. Such a process can include a step of searching for signal power (e.g., searching for high power broadcast channels) to tune the frequencies of the one or more pass bands. This information about channel or frequency can be taken either from a layered UE protocol stack (e.g., 3GPP channel numbers) or from somewhere in the processing chain that does translation of channel number to PLL setting. In some embodiments, this process involves looking up a first scan frequency, moving the first tunable reject band away from a PLL scan frequency, programming the first tunable pass band to align with the PLL scan frequency, and performing a scan. If it is determined that the receive filter loss at a given scan frequency is too high (e.g., above a predetermined threshold), the process can be repeated for a new scan frequency. The method can further be repeated for each carrier band to be aggregated.

Alternatively, in some embodiments, the carrier aggregation bands are established from downlink information (e.g., UE downlink protocol stack information) received from base station 200 (e.g., from a BTS base station) with which wireless frequency division duplex system 100 is communicating. In this embodiment, the receive frequency (or frequencies) are identified, and an associated transmit frequency is also looked up if available. The first reject band frequency is moved away from the receive frequency (e.g., to the transmit frequency). The first reject band frequency can then be aligned with the receive frequency, and signal reception can thus be performed.

In yet a further alternative algorithm, for a frequency-division duplexing mode, channel and band information can be received from base station 200. In some embodiments, for example, this channel and band information includes a first receive band, a transmit band, and a second (e.g., carrier aggregation) receive band (if available). The duplex spacing for the first receive band can be either calculated or looked up for known values. The first rejection band frequency can be set to match the transmit band frequency (e.g., as close to the first receive band as the insertion loss allows). If the carrier aggregation duplex spacing is negative, the tunable low-pass filter 131-2 of tunable diplex filter 130 can be tuned to match the first receive band frequency. Otherwise, tunable high-pass filter 131-1 of tunable diplex filter 130 can be tuned to match the first receive band frequency. Similar steps can further be used to adjust the tuning settings of tunable diplex filter 130 and/or receive front end 150 with respect to further carrier aggregation bands.

In any of these embodiments of a tuning algorithm according to the presently disclosed subject matter, those having skill in the art will recognize that, although the embodiments above are described as solutions that involve received (RX) and transmitted (TX) signals, other embodiments are contemplated for a filter in which only the receive characteristics or only the transmit characteristics are considered.

In yet another aspect of the present subject matter, a circuit implementation of a filter having such programmable response characteristics described above is provided. In particular, referring to the exemplary embodiment illustrated in FIG. 11, a circuit implementation of tunable diplex filter 130 is provided. In this configuration, tunable diplex filter 130 is arranged between an input node 132 and both a first output node (e.g., a high-pass output node 139) and a second output node (e.g., a low-pass output node 149). In particular, a first high-pass series capacitor 133 passes signals to the high-pass path (i.e., between input node 132 and high-pass output node 139). In some embodiments, first high-pass series capacitor 133 is set at a predetermined (i.e., fixed) capacitance to define a fixed frequency above which signals can be passed. Alternatively, in other embodiments, first high-pass series capacitor 133 is a variable capacitor that is tunable to vary the range of frequencies that are passed to the high-pass path.

In either arrangement, those signals that are passed by first high-pass series capacitor 133 are supplied to tunable high-pass filter 131-1 of tunable diplex filter 130, which comprises a second high-pass series capacitor 134 connected in series between first high-pass series capacitor 133 and high-pass output node 139. In addition, a first high-pass shunt inductor 135 and a first high-pass shunt capacitor 136 are connected between the series connection of first and second high-pass series capacitors 133 and 134 and a ground 140, and a second high-pass shunt inductor 137 and a second high-pass shunt capacitor 138 are connected between high-pass output node 139 and ground 140.

Similarly, a parallel combination of a first low-pass series capacitor 142 and a first low-pass series inductor 141 function as a low-pass filter to pass signals to the low-pass path (i.e., between input node 132 and low-pass output node 149). Similarly to the configuration of first high-pass series capacitor 133, first low-pass series capacitor 142 can be either a fixed element or a variable capacitor depending on whether or not it is desired to be able to adjust the cut-off frequency of the low-pass path. In yet further alternative embodiments, first low-pass series capacitor 142 is omitted, with first low-pass series inductor 141 alone providing the filtering to define the low-pass path. In any configuration, those signals that are passed to the low-pass path are provided to tunable low-pass filter 131-2 of tunable diplex filter 130, which comprises a second low-pass series inductor 143 connected in series between first low-pass series capacitor 142 and low-pass output node 149. In addition, in the configuration illustrated in FIG. 11, an optional second low-pass series capacitor 144 is connected in parallel with second low-pass series inductor 143 between first low-pass series capacitor 142 and low-pass output node 149. A first low-pass shunt inductor 145 and a first low-pass shunt capacitor 146 are connected between the series connection of first and second low-pass series inductors 141 and 143 and ground 140, and a second low-pass shunt inductor 147 and a second low-pass shunt capacitor 148 are connected between low-pass output node 149 and ground 140.

In some configurations of tunable diplex filter 130, one or both of first high-pass shunt capacitor 136 or second high-pass shunt capacitor 138 is a variable impedance element that is tunable to adjust the frequencies blocked by the first tunable reject band, and one or both of first low-pass shunt capacitor 146 or second low-pass shunt capacitor 148 is a variable impedance element that is tunable to adjust the frequencies blocked by the second tunable reject band. As discussed above, in some embodiments, it is advantageous for the second tunable reject band to be tuned to block substantially the same frequencies that are blocked by the first tunable reject band (e.g., a common rejected frequency band associated with a transmit frequency).

Further, the pass band characteristics of the first tunable pass band can be determined by the configuration of second high-pass series capacitor 134, which acts as a first coupling element between a first high-pass shunt impedance element (e.g., the combination of first high-pass shunt inductor 135 and first high-pass shunt capacitor 136) and a second high-pass shunt impedance element (e.g., the combination of second high-pass shunt inductor 137 and second high-pass shunt capacitor 138). In this arrangement, the first and second high-pass shunt impedance elements can be configured to act as resonators tuned to create notches that substantially align in frequency. The impedances of these resonators for a frequency on one side of the resonance will have similar inductive or capacitive reactances. Second high-pass series capacitor 134 can provide an appropriate reactance connected between the two resonators that will effectively cancel the resonator reactances over a range of frequencies, creating a passband. Thus, for a given frequency, this arrangement can approximate a lumped element transmission line port impedance to match the input and output port impedances, and this transmission line can be configured to be high-pass or low-pass depending on which side of the notch the passband is to be created.

The characteristics of this first tunable pass band can accordingly be programmable by tuning the value of second high-pass series capacitor 134. Likewise, the pass band characteristics of the second tunable pass band can be determined by the configuration of second low-pass series inductor 143 and second low-pass series capacitor 144, which together act as a second coupling element between a first low-pass shunt impedance element (e.g., the combination of first low-pass shunt inductor 145 and first low-pass shunt capacitor 146) and a second low-pass shunt impedance element (e.g., the combination of second low-pass shunt inductor 147 and second low-pass shunt capacitor 148). The characteristics of this second tunable pass band can be programmable by tuning the value of second low-pass series capacitor 144.

Figure 11:
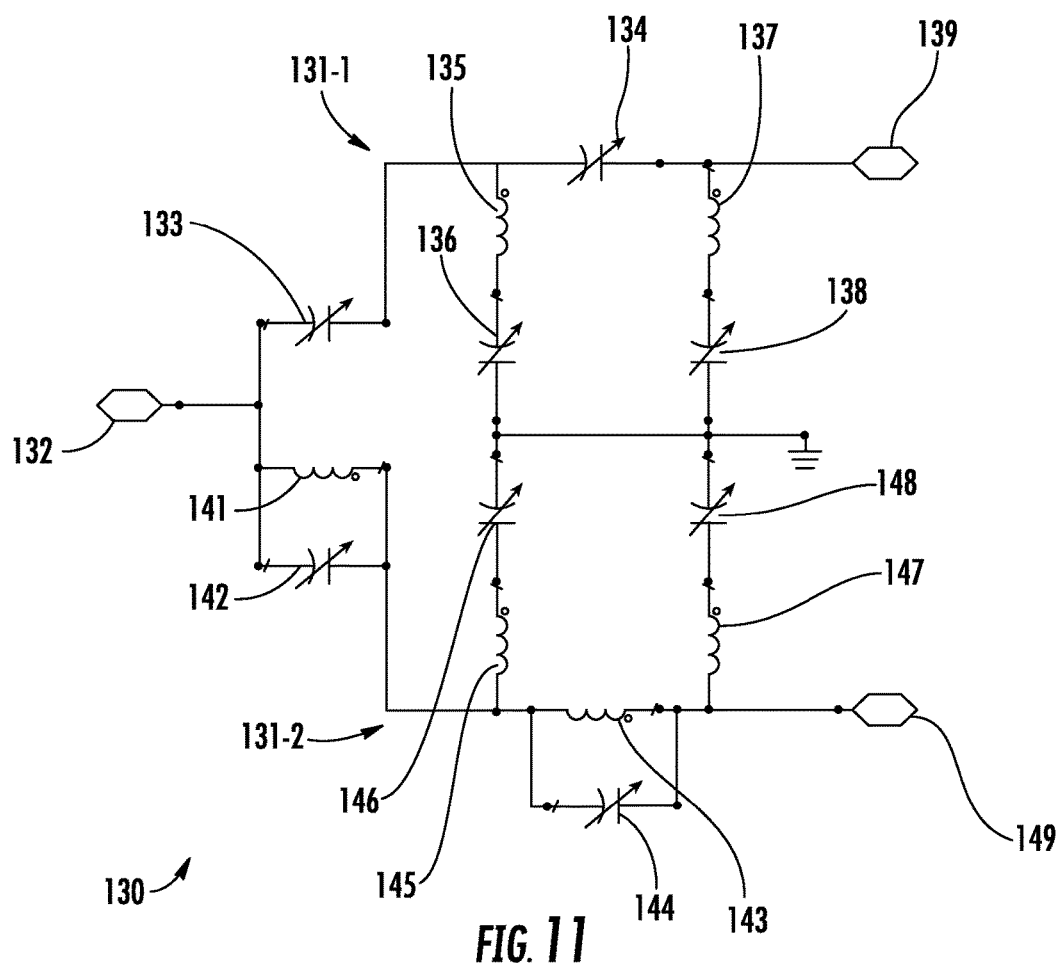
FIG. 11 is circuit diagram of a tunable diplex filter according to an embodiment of the presently disclosed subject matter.

In addition, although the embodiment shown and described with respect to FIG. 11 herein provides that both of tunable high-pass filter 131-1 and tunable low-pass filter 131-2 have a generally Pi-shaped configuration, those having ordinary skill in the art will recognize that any of a variety of other configurations for tunable high-pass filter 131-1 and tunable low-pass filter 131-2 can likewise provide the desired selective filtering of the high-pass and low-pass signals, respectively. In particular, for example, with respect to tunable high-pass filter 131-1, whereas the embodiment discussed above provides that the second high-pass series capacitor 134 acts as a first coupling element between a first high-pass shunt impedance element (e.g., the combination of first high-pass shunt inductor 135 and first high-pass shunt capacitor 136) and a second high-pass shunt impedance element (e.g., the combination of second high-pass shunt inductor 137 and second high-pass shunt capacitor 138), those having skill in the art will recognize that an alternative embodiment of tunable high-pass filter 131-1 can be implemented in which a shunt-connected element provides coupling between two series-connected resonators to provide the desired tunable reject band characteristics and tunable pass band characteristics (i.e., a T-shaped arrangement).

In any configuration, those having skill in the art will recognize that the first coupling element (i.e., second high-pass series capacitor 134) can produces a signal response that is primarily capacitive, whereas the second coupling element (i.e., second low-pass series inductor 143 and second low-pass series capacitor 144) can be configured to produce a signal response that is primarily inductive. As a result, this configuration of tunable diplex filter 130 allows the first tunable pass band to pass relatively higher-frequency signals and the second tunable pass band to pass relatively lower-frequency signals.

With respect to any of these tunable elements discussed above, the variable impedance elements can comprise a MEMS capacitor, a semiconductor-switched capacitor (e.g., implemented using CMOS, SOI, pHEMT), a varactor, or a tunable ceramic element like barium strontium titanate (BST). Accordingly, the tuning of the respective variable impedance elements is achieved using electro-mechanical actuation (e.g., MEMS), electric field actuation (e.g., using pin diodes or tunable dielectrics like BST), or electrical semiconductor switches connected to an array of capacitances. In the case of electrical semiconductor switches, actuation can be based on voltage field switching (e.g., pHEMT, JFET, CMOS) or current switching (e.g., bipolar transistors like GaAs HBT). Depending on the type of element used, the impedance can thus be varied either using a serial bus (e.g., SPI, RFFE, I2C) or programmable registers that control the impedance value of the variable element through semiconductor devices (e.g., transistors, gates, ADCs). In some embodiments, such variable impedances are programmable to an integer number of discrete capacitance settings, such as according to a binary weighting scheme or according to a linear weighting scheme.

Furthermore, in some embodiments, the elements of tunable diplex filter 130 can be implemented using module technology characterized by having a common carrier on which components of multiple modules are integrated or mounted and interconnected. The common carrier can then be divided (e.g., using SAW or routing) into individual modules. Some examples of a common carrier for this purpose can include a wafer as used for planar circuit semiconductors (e.g., a silicon wafer), a wafer as used for processing MEMS devices, or a "strip" that is commonly used for packaging and modules, which can be manufactured using package laminate processing or Printed Circuit Board (PCB) technology or build up board processing.

In any implementation, the impedance elements in either or both of tunable high-pass or low-pass filters 131-1 or 131-2 can be capable of making a variable frequency response between the input (i.e., input node 132) and the output (i.e., a respective one of high-pass output node 139 or low-pass output node 149). In this way, the one or more pass bands and matching can be moved relative to the respective notch frequency to any of a variety of tuning states, both above (i.e., positive duplex spacing) and below (i.e., negative duplex spacing) a specified reference band (e.g., a transmit frequency band that is blocked by either or both of the first and second tunable reject bands). In any tuning state, tunable diplex filter 130 can be configured to minimize a total pass band loss (e.g., total loss of less than about 5-7 dB) and maximize a reject band attenuation (e.g., attenuation of more than about 15-18 dB) at corresponding duplex frequencies.

In all of the aspects of the present subject matter discussed above, the problem of supporting multiple bands in a wireless communications system (e.g., an LTE terminal) is addressed. In particular, for example, the present devices, systems, and methods provide a solution for how to design receiver chains to support carrier aggregation with positive or negative duplex spacings or combinations thereof. Specifically, the transfer of carrier aggregation signals through a diplexer and the ability to switch between receive branches is achieved using switchable LNA's and switch devices.

In addition, the presently-disclosed subject matter provides a solution for the problem of setting up tunable filters for reception or transmission in basestation-controlled terminals. Further in this regard, the present subject matter also addresses the problem of providing necessary information from a wireless basestation system to a control filter both when a protocol link is established and when a link is not established.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter. In particular, for example, although some of the embodiments described herein describe signal reception elements of a wireless frequency division duplex system, those having skill in the art will recognize that the concepts discussed herein are similarly applicable to signal transmission elements.

What is claimed is:

1. A tunable diplex filter for a wireless frequency division duplex system, the tunable diplex filter comprising:
    a diplexer in communication between an input node and first and second output nodes, the diplexer being configured to separate signals present at the input node into a first signal to the first output node and a second signal to the second output node, wherein the diplexer comprises;
        a first tunable filter in communication between the input node and the first output node, the first tunable filter comprising a first high-pass tunable element that is tunable to adjust frequencies of a first reject band in which signals in the first tunable filter are attenuated, and the first tunable filter comprising a second high-pass tunable element that is tunable to adjust frequencies of a first tunable pass band configured to have a minimum pass band insertion loss at any of a range of frequencies that are higher than the first reject band; and
        a second tunable filter in communication between the input node and the second output node, the second tunable filter comprising a first low-pass tunable element that is tunable to adjust frequencies of a second reject band in which signals in the second tunable filter are attenuated, and the second tunable filter comprising a second low-pass tunable element that is tunable to adjust frequencies of a second tunable pass band configured to have a minimum pass band insertion loss at any of a variety of frequencies that are lower than the first reject band;
        wherein the first reject band, the first tunable pass band, the second reject band, and the second tunable pass band are together selectively tunable to concurrently pass multiple signals in different frequency bands.

2. The tunable diplex filter of claim 1, wherein the first reject band, the first tunable pass band, the second reject band, and the second tunable pass band are configured to concurrently pass a plurality of signals having frequencies associated with different carrier aggregation bands.

3. The tunable diplex filter of claim 1, wherein one or both of the first high-pass tunable element of the first tunable filter or the first low-pass tunable element of the second tunable filter comprises a first resonator and a second resonator configured to block signals within a respective one of the first reject band or the second reject band; and
    wherein one or both of the second high-pass tunable element of the first tunable filter or the second low-pass tunable element of the second tunable filter comprises one or more coupling impedance element connected to both the first resonator and the second resonator, the one or more coupling impedance element being tunable to vary a frequency at which an insertion loss of a respective one of the first tunable pass band or the second tunable pass band is a relative minimum.

4. The tunable diplex filter of claim 3, wherein the first resonator comprises at least one first shunt impedance element connected between the diplexer and a ground;
    wherein the second resonator comprises at least one second shunt impedance element connected between the respective one of the first output node or the second output node and the ground; and
    wherein the one or more coupling impedance element is connected in series between the diplexer and the respective one of the first output node or the second output node.

5. The tunable diplex filter of claim 3, wherein the one or more coupling impedance element comprises one or more tunable capacitor.

6. The tunable diplex filter of claim 5, wherein the one or more coupling impedance element comprises one or more inductor connected in parallel with the one or more tunable capacitor.

7. The tunable diplex filter of claim 3, wherein the one or more coupling impedance element is tunable to vary a frequency at which an insertion loss of a respective one of the first tunable pass band or the second tunable pass band is less than about 7 dB.

8. A wireless frequency division duplex system comprising:

a tunable diplex filter comprising an input node, a high-pass output node, and a low-pass output node;

wherein the tunable diplex filter is configured to exhibit tunable reject band characteristics that are programmable such that signals in a desired transmit frequency band are attenuated and tunable pass band characteristics that are programmable to concurrently pass multiple signals in different frequency bands, wherein signals passed to the high-pass output node have a minimum pass band insertion loss at any of a range of frequencies that are above the desired transmit frequency band and signals passed to the low-pass output node have a minimum pass band insertion loss at any of a range of frequencies that are below the desired transmit frequency band.

9. The wireless frequency division duplex system of claim 8, comprising a receive front end in communication with the high pass output node and the low pass output node;

wherein the receive front end comprises one or more first pairs of a low-noise amplifier and a frequency-selection mixer in communication with the high pass output node and one or more second pairs of a low-noise amplifier and a frequency-selection mixer in communication with the low pass output node;

wherein each of the first pairs and the second pairs of the low-noise amplifier and the frequency-selection mixer are configured to pass signals having frequencies associated with a discrete carrier band.

10. The wireless frequency division duplex system of claim 9, wherein the receive front end comprises:

a first additional low-noise amplifier in communication with the high-pass output node;

a second additional low-noise amplifier in communication with the low-pass output node; and a common frequency-selection mixer in communication with both of the first additional low-noise amplifier and the second additional low-noise amplifier, wherein the common frequency-selection mixer is configured to be selectively connected to either the first additional low-noise amplifier or the second additional low-noise amplifier.

11. The wireless frequency division duplex system of claim 9, wherein the receive front end comprises:

a first dummy low-noise amplifier in communication with the high-pass output node; and a second dummy low-noise amplifier in communication with the low-pass output node;

wherein the first and second dummy low-noise amplifiers are configured to provide a constant impedance at a respective one of the high-pass output node or the low-pass output node.

12. A method for tuning a wireless frequency division duplex system, the method comprising:

identifying a first receive band, a second receive band, and a transmit band;

if one or both of the first receive band or the second receive band comprise frequencies that are greater than frequencies of the transmit band:

tuning a first tunable filter to move a first tunable pass band towards the frequencies of the one or both of the first receive band or the second receive band; and tuning the first tunable filter to define a first reject band at the frequencies of the transmit band; and if one or both of the first receive band or the second receive band comprise frequencies that are less than frequencies of the transmit band:

tuning a second tunable filter to move a second tunable pass band towards the frequencies of the one or both of the first receive band or the second receive band; and tuning the second tunable filter to define a second reject band at the frequencies of the transmit band.

13. The method of claim 12, wherein identifying the first receive band and the second receive band comprises:

establishing a scan of power over frequency; and setting the first receive band and the second receive band at frequencies at which a receive filter loss is below a predetermined threshold.

14. The method of claim 12, wherein identifying the first receive band, the second receive band, and the transmit band comprises:

receiving channel and band information from downlink information from a base station with which the wireless frequency division duplex system is communicating.

* * * * *